United States Patent
Goller et al.

(10) Patent No.: US 7,026,547 B1
(45) Date of Patent: Apr. 11, 2006

(54) SEMICONDUCTOR DEVICE AND A METHOD FOR FABRICATING A SEMICONDUCTOR DEVICE

(75) Inventors: Klaus Goller, Dresden (DE); Stefan Eckert, Dresden (DE); Anja Oesinghaus, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/040,176

(22) Filed: Jan. 21, 2005

(51) Int. Cl.
*H02G 3/08* (2006.01)

(52) U.S. Cl. .................. 174/52.1; 174/260; 361/746; 361/762

(58) Field of Classification Search .......... 174/52.1, 174/260; 361/746, 762
See application file for complete search history.

(56) References Cited

U.S. PATENT DOCUMENTS

| | | | |
|---|---|---|---|
| 6,064,576 A | * | 5/2000 | Edwards et al. ............ 361/776 |
| 6,509,529 B1 | * | 1/2003 | Kamath et al. ............. 174/255 |
| 6,593,527 B1 | * | 7/2003 | Brandenburg et al. ..... 174/52.1 |
| 6,617,211 B1 | | 9/2003 | Niuya |
| 6,617,510 B1 | * | 9/2003 | Schreiber et al. .......... 174/52.2 |
| 6,861,587 B1 | * | 3/2005 | SelVakumar et al. ...... 174/52.1 |

* cited by examiner

*Primary Examiner*—Hung V. Ngo
(74) *Attorney, Agent, or Firm*—Slater & Matsil, L.L.P.

(57) ABSTRACT

A semiconductor device (10) includes a semiconductor component integrated in a semiconductor substrate and a conductive pad (110) arranged on top of the semiconductor device (10). The conductive pad is electrically connected with the semiconductor component. The pad is arranged for connecting the semiconductor device (10) externally. A dielectric material (310) is positioned between the conductive pad (110) and a buried conductive layer (20) of the semiconductor device. The dielectric material (310) comprises a stress blocking structure.

35 Claims, 8 Drawing Sheets

SEMICONDUCTOR DEVICE AND A METHOD FOR FABRICATING A SEMICONDUCTOR DEVICE

TECHNICAL FIELD

This invention relates generally to a semiconductor device, e.g., a semiconductor memory chip such as a DRAM-device, and also relates to a method of fabricating a semiconductor device.

BACKGROUND

U.S. Pat. No. 6,617,211 discloses a memory integrated circuit and a method of fabricating a crown-cell capacitor for memory integrated circuits. The circuit comprises a multi-layer structure with a plurality of conductive layers which are insulated from another by insulating layers. In order to connect the integrated circuit externally, conductive pads are arranged on top of the circuit. The conductive pads are separated from the uppermost conductive layer by a dielectric material.

In order to minimize the production costs of semiconductor devices, their size is kept as small as possible. The thickness of all layers of the semiconductor device is chosen as thin as possible to minimize process time of deposition. As a result for the lateral and vertical minimization, the mechanical robustness of the devices is reduced. If, for example, probe needles are placed on top of the conductive pads in order to test the electrical behavior of the device, the mechanical force applied to the pads, may not be too large. If the mechanical force exceeds a certain value, the insulating material—i.e., the dielectric material between the conductive pad and the uppermost conductive buried layer or the dielectric material in-between the conductive buried layers—may break and internal cracks may result. Usually, these cracks do not destroy the device at once. However, they may result in a reduced device's lifetime and reliability in terms of product functionality. For instance, due to lacking diffusion barriers for copper, migration process starts and conductive material may migrate through the barrier-crack or/and along the cracks through the insulating material and may cause electrical short-circuits between isolated conducting wires.

In order to solve this problem, prior art devices usually do not use the area below conductive pads for buried conductive layers. In prior art devices, the space below these pads is electrically inactive in order to avoid short-circuits due to mechanical cracks. This space could consist of pure dielectric material without any structures. Another possibility is to fill the space up with periodic structures for unit process reasons. In all cases the space under the pads are not used for functional electrical wiring.

SUMMARY OF THE INVENTION

In one aspect, the present invention provides a semiconductor device that may be manufactured at low costs.

In a further aspect, the invention provides a semiconductor device that is mechanically robust and ensures a long lifetime without negative impact on functional product reliability.

A further aspect of the invention is that the area below conductive pads may also be used for buried conductive layers in order to increase the integration density of the device and to further decrease the production costs.

Accordingly, an improved semiconductor device is achieved.

According to a preferred embodiment of the invention, the dielectric material between the conductive pads and the uppermost buried conductive layer comprises at least one stress blocking structure.

One aspect of the invention is that vertical and lateral mechanical forces that will be applied to the conductive pads from outside—e.g., by measurement probe needles, wire-bonding or molding during packaging—are absorbed or led off by the stress blocking structure. Due to this stress blocking structure, the risk that short-circuits occur is reduced significantly. In consequence, the lifetime and reliability of the devices increases.

An additional advantage of the invention is that buried conductive layers can be positioned even below pads as the risk of short-circuits due to cracks is very small. Accordingly, the integration density of the inventive devices is increased and the production costs are not increased.

According to a first embodiment of the invention, the stress blocking structure comprises a stress relief layer consisting of or containing a material that transforms a vertical mechanical stress gradient mainly into a lateral stress gradient. In other words, vertical mechanical forces are transformed into lateral mechanical forces and led away from the interface of the buried conductive layer. The stress relief layer may be structured or unstructured.

Such a stress relief layer may be formed by manipulating the deposition process of the stress relief layer. For example, during deposition of the stress relief layer, the process parameters are adjusted such that a predetermined lateral and vertical layer stress is induced into the layer. For example, tensile layer stress and compressive layer stress may be induced during the deposition and a stress gradient will result inside the layer. Such a layer offers an optimized interface between the portions above and below the stress relief layer and therefore acts as a supporting layer for the upper portion and as a stop layer for the lower one. Near the stress relief layer the film properties change with respect to an optimized crack stop. For example, one can modify the film properties of the stress relief layer to weaken and compensate the mechanical vertical and lateral forces by a defined ration of vertical-lateral stress. Finally, a layer with the behavior mentioned above, will result.

Preferably, the dielectric material also comprises a first additional layer with significant changed film properties. This additional layer may be a blocking layer an E-module (modulus of elasticity) exceeding the E-module of the stress relief layer. This means that the blocking layer is "harder" than the stress relief layer. The blocking layer should be arranged below the stress relief layer in order to block the remaining vertical forces that are not transformed and led away by the stress relief layer. The E-module (modulus of elasticity) is defined as the ability of a solid for a linear elastic deformation. The higher the value increases the harder the solid performs against share- or pull-forces. In order to block vertical forces efficiently, the blocking layer's E-module should exceed at least 200 GPa. The blocking layer may comprise silicon-oxynitride, silicon nitride or silicon carbide, as examples.

Additionally, the dielectric material may also comprise a second additional layer. This second additional layer is preferably a soft layer with an E-module that is smaller than the E-module of the blocking layer. The soft layer should be positioned below the blocking layer in order to separate the blocking layer from the buried conductive layer.

The soft layer's E-module is preferably smaller than 200 GPa. The soft layer may consist of oxide material such as FSG, which is a fluorinated oxide and is used as a "low-k" dielectric.

The soft layer and the stress relief layer may consist of different materials or of the same material. In the latter case, a kind of sandwich structure is created containing the blocking layer therein.

According to a second embodiment of the invention, the stress blocking structure comprises at least three layers including a soft layer, a blocking layer and a stress relief layer. The stress relief layer is arranged on top of the blocking layer and the blocking layer is arranged on top of the soft layer. The E-module of the blocking layer exceeds the E-modules of both the soft layer and the stress relief layer. The soft layer and the stress relief layer consist of standard materials such as oxides deposited according to standard manufacturing processes. For example, the stress relief layer is made of standard CVD (chemical vapor deposition)-oxide.

The soft layer and the stress relief layer may consist of materials with different E-modules. In this case, the E-module of the stress relief layer exceeds the E-module of the soft layer.

Alternatively, the soft layer and the stress relief layer consist of the same soft material. In this case, the E-module of the soft material is preferably smaller than 200 GPa. The soft material can be FSG-oxide, for example.

The invention also relates to a method of fabricating a semiconductor device containing a stress blocking structure as described above.

BRIEF DESCRIPTION OF THE DRAWINGS

Other aspects and advantages of the invention become apparent upon reading of the detailed description of the invention, and the appended claims provided below, and upon reference to the drawings in which:

DETAILED DESCRIPTION OF ILLUSTRATIVE EMBODIMENTS

In FIGS. 1–8, identical numerals are used for identical or similar objects.

Figure 1:
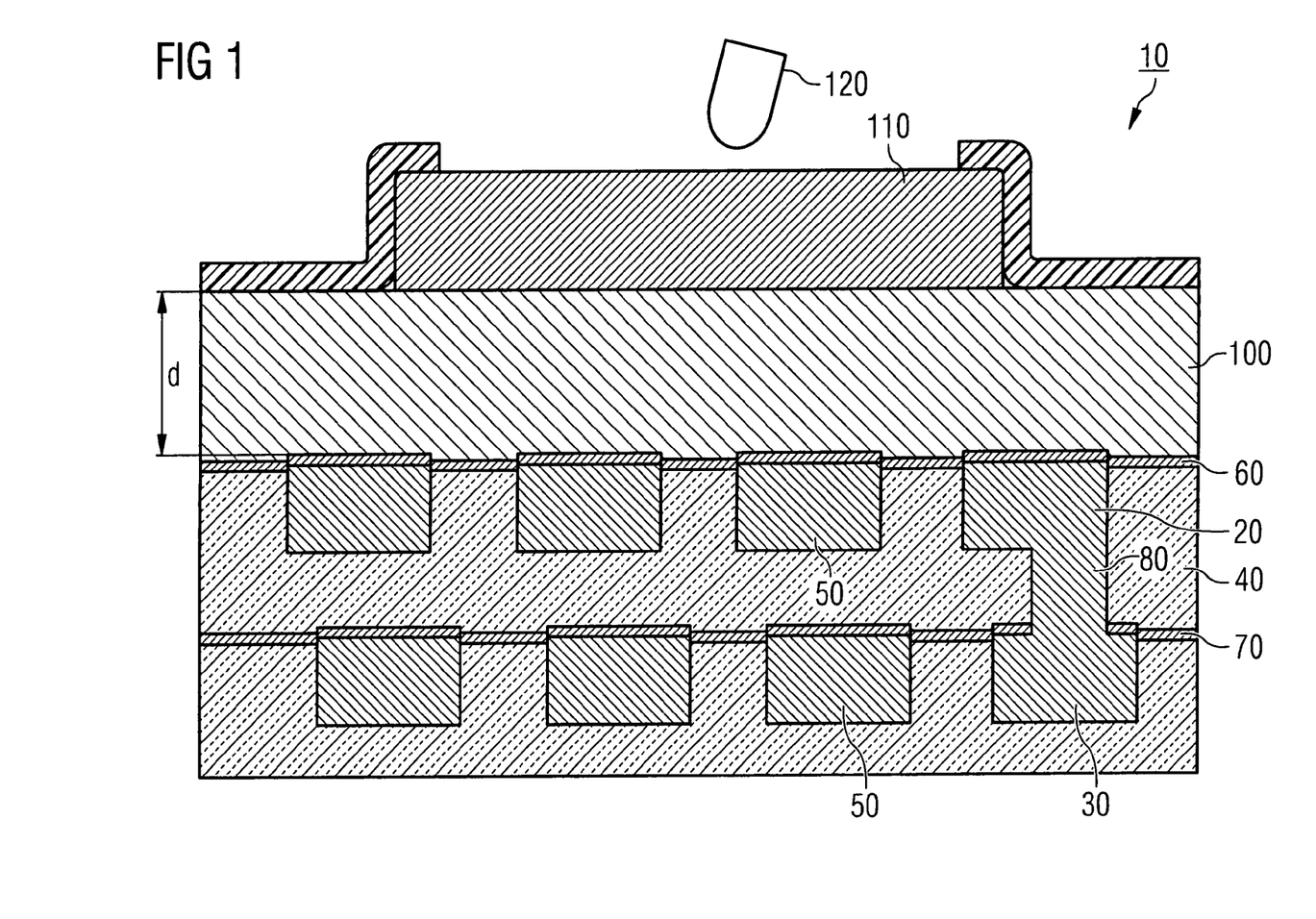
FIGS. 1–4 illustrate a device without an inventive stress blocking structure.

FIG. 1 shows a device 10 comprising a first buried conductive layer 20 and a second buried conductive layer 30. In the preferred embodiment, both conductive layers comprise copper, and they are isolated from another by a dielectric interlayer 40 (e.g., silicon oxide, fluorinated oxide, or another dielectric). Both conductive layers 20 and 30 are structured and provide circuit paths 50.

Beneath the first buried conductive layer 20 and the second buried conductive layer 30 is a semiconductor component integrated in a semiconductor substrate (not explicitly illustrated). The semiconductor component can be a semiconductor memory chip such as a DRAM-device. The conductive layers 20 and 30 serve to interconnect the various components of the semiconductor integrated circuit.

As can be seen in FIG. 1, both copper layers 20 and 30 are covered by additional insulation layers 60 and 70, which preferably comprise silicon nitride. In the preferred embodiment, the thickness of both nitride layers 60 and 70 is approximately 100 nm, as an example.

In order to achieve electrical connections between the circuits paths 50 of both buried conductive layers 20 and 30, plated-through holes 80 are positioned in-between.

On top of the upper buried layer 20 a dielectric material 100 is arranged. The dielectric material 100 separates the upper buried layer 20 from a conductive pad 110 made of an AlCu-alloy. In the preferred embodiment, the dielectric material 100 comprises a silicon oxide layer. Its thickness d is about 900 nm and its E-module is about 70 GPa. The conductive pad is arranged over a semiconductor device (not shown) and is electrically connected with semiconductor components of the device. The pad is arranged for connecting the semiconductor device externally (e.g., via a semiconductor package or test equipment).

In FIG. 1, a probe needle 120 can be seen. This probe needle 120 is pressed on top of the conductive copper pad 110 (E-module appox. 110 GPa) in order to contact the device 10 for test purposes. This is shown in detail in FIG. 2.

Figure 2:
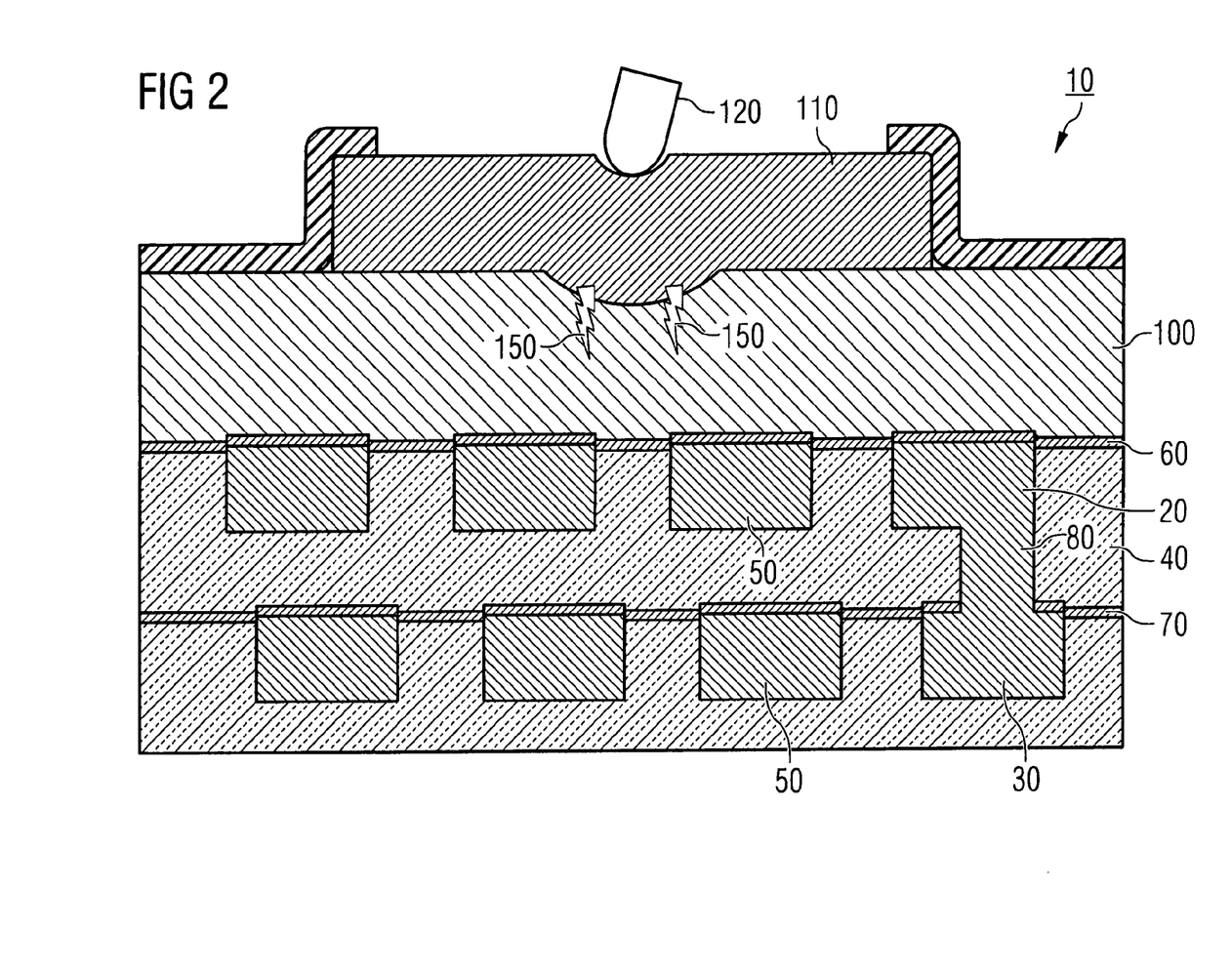

FIG. 2 also shows cracks 150 that will occur in the dielectric material 100 due to mechanical stress caused by the probe needle 120.

Figure 3:
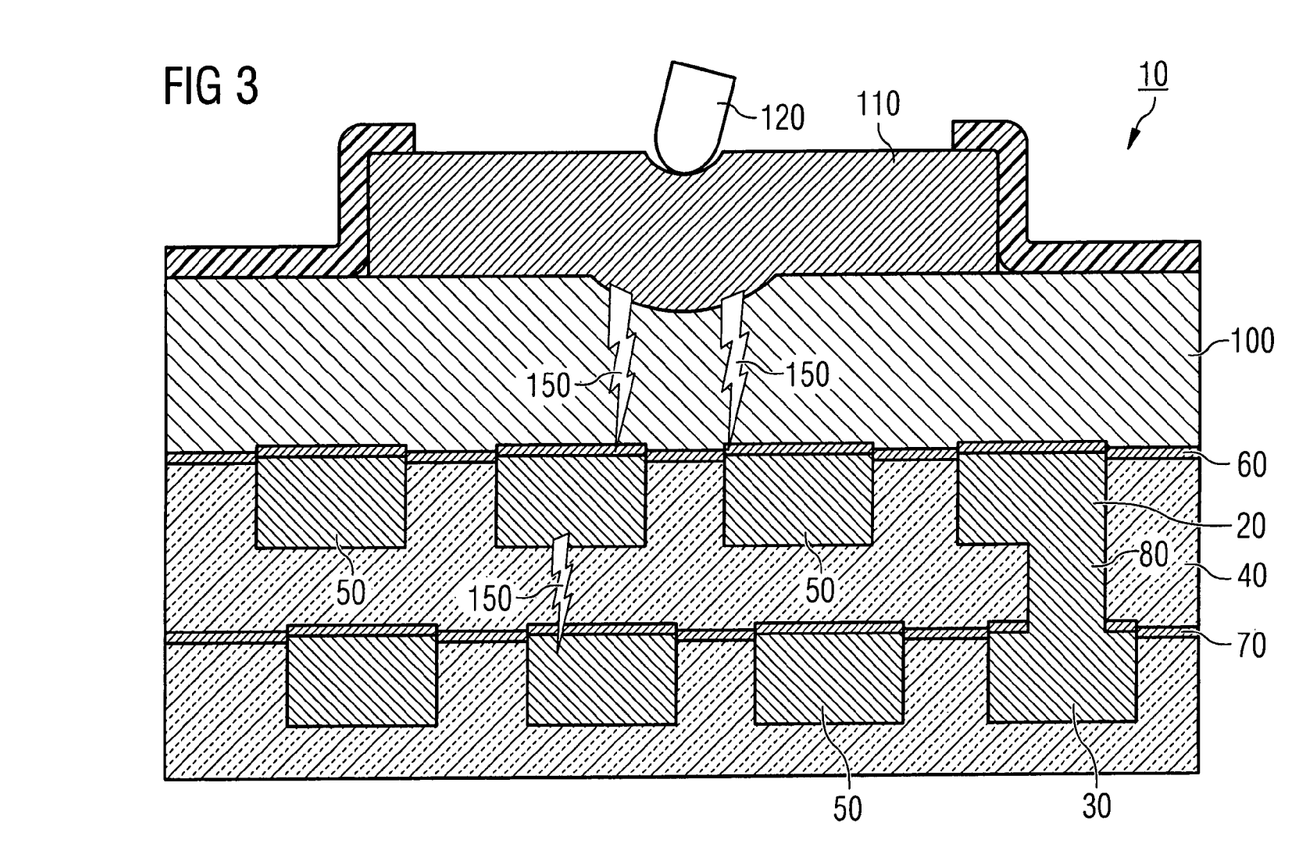

FIG. 3 illustrates that the cracks 150 will move further down to the insulation layer 60 and to the buried conductive layer 20. Even the dielectric interlayer 40 and the second buried conductive layer 30 can be affected by the cracks 150.

Figure 4:
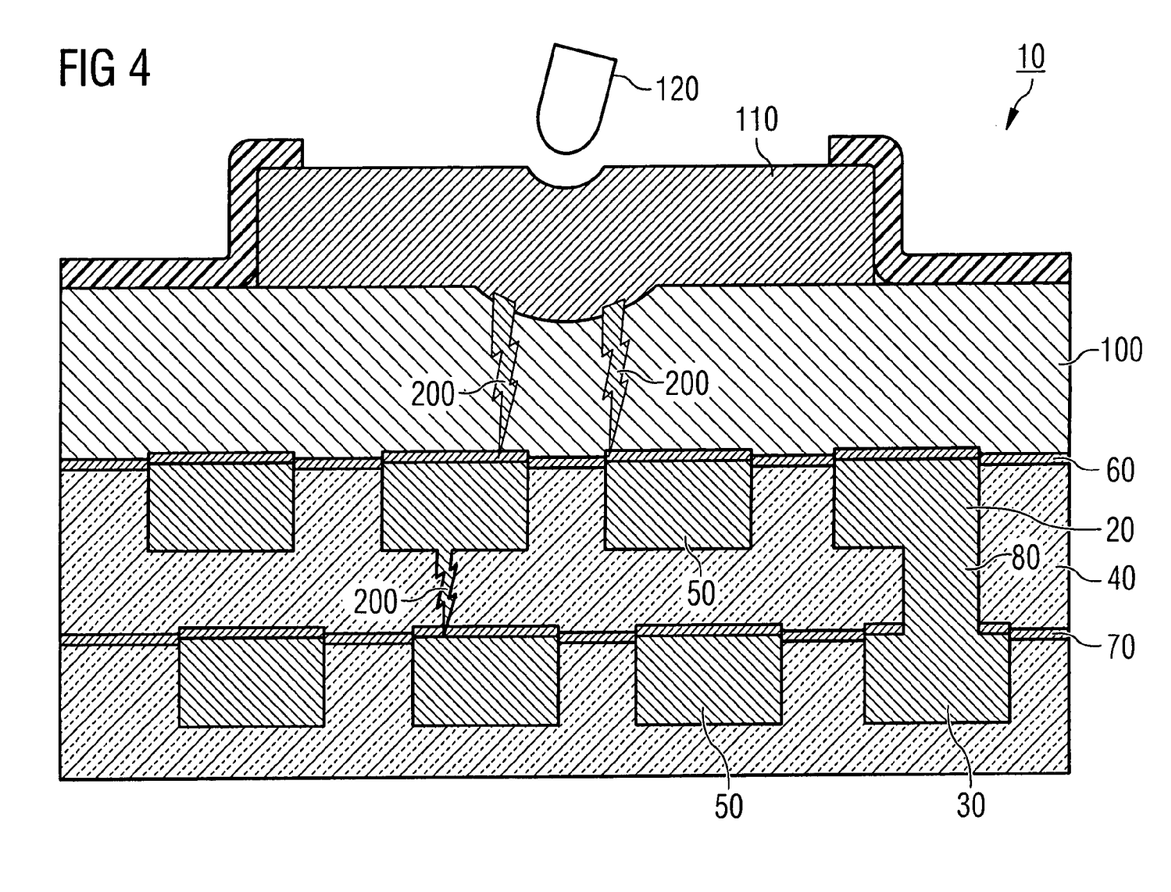

In the long term, migration of conductive material will occur, and short-circuits 200 along the cracks 150 will result. This is shown in FIG. 4. Short-circuits 200 can appear between the conductive pad 110 and the buried conductive layer 20 and in-between the buried layers 20 and 30.

If the device 10 comprises more than two buried conductive layers, all of them can be affected by short-circuits 200.

Figure 5:
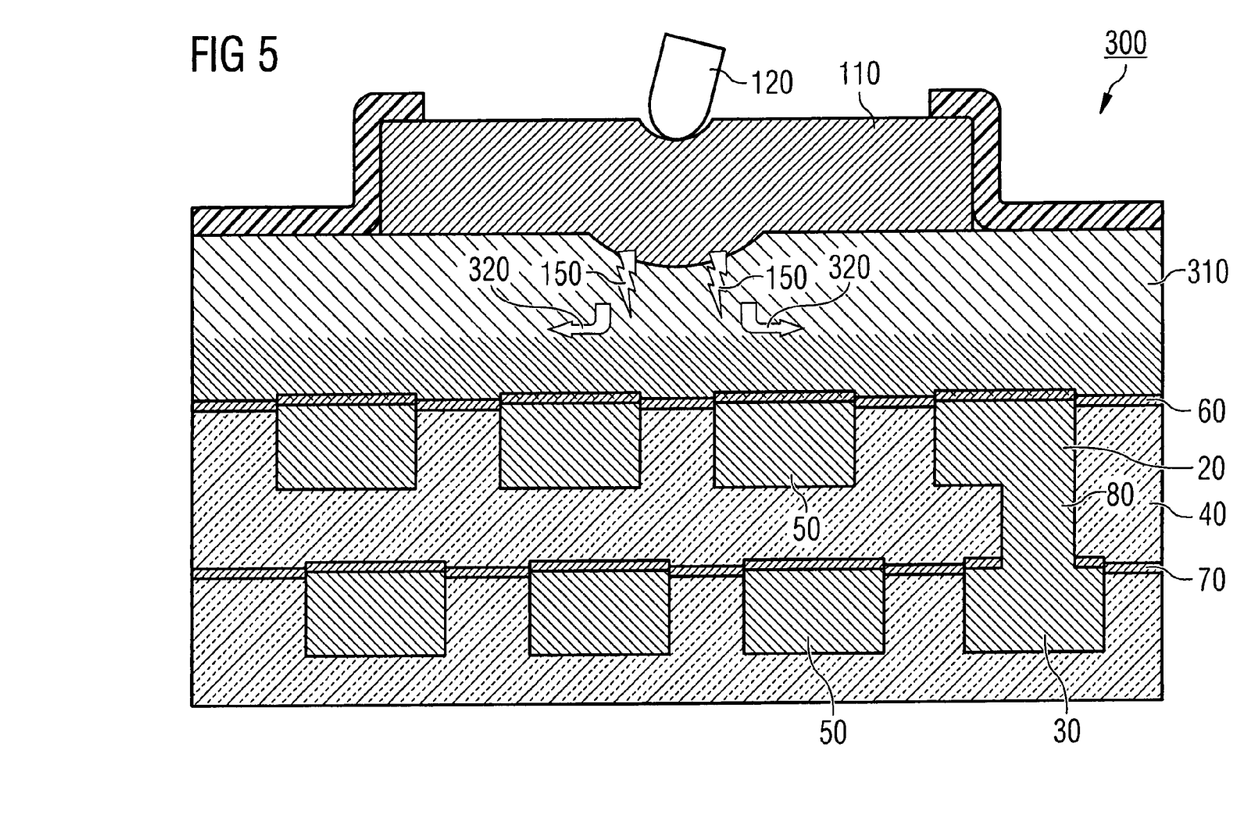
FIGS. 5–8 illustrate inventive devices with stress blocking structures.

FIG. 5 shows a device according to a first embodiment of the invention. This device 300 comprises a stress blocking structure consisting of a stress relief layer 310 between the conductive pad 110 and the upper buried layer 20. This stress relief layer 310 turns the vertical mechanical forces applied by the probe needle 120, mainly into lateral forces. This is visualized in FIG. 5 by arrows 320. Therefore, most of the vertical stress is transformed into lateral stress.

The stress relief layer 310 consists of oxide which is deposited such that a predetermined lateral and vertical stress gradient is induced inside the layer. This stress gradient comprises tensile layer stress and/or compressive layer stress in order to achieve the described "relief behavior". This could be achieved by changing the deposition rate (e.g., modify of chemical composition or RF power) or treatment of the layer during deposition (e.g., temperature of the wafer; additional gases).

Figure 6:
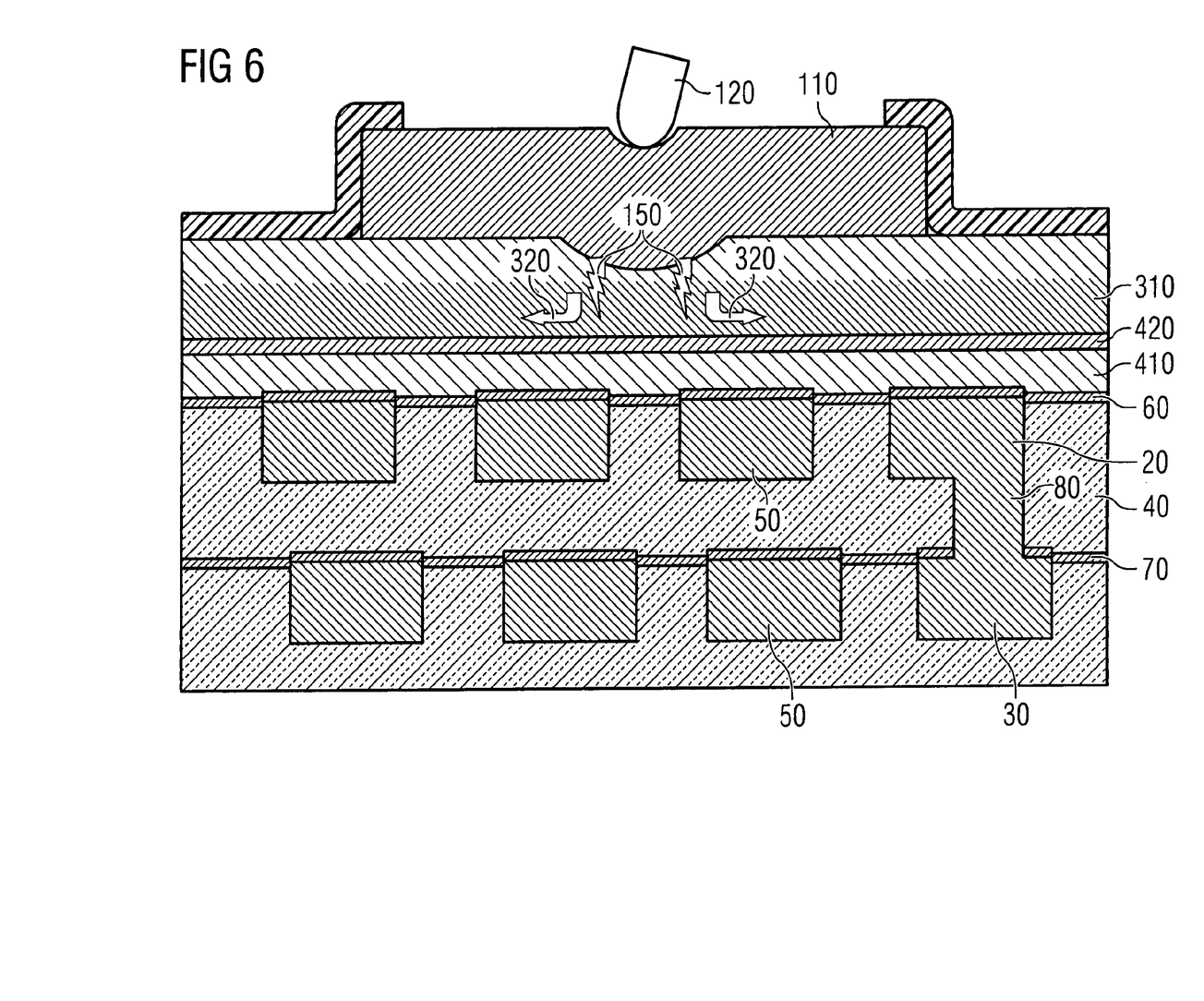

FIG. 6 shows a device 400 according to a second embodiment of the invention. The device 400 comprises a stress blocking structure containing a soft layer 410, a blocking layer 420 and a stress relief layer 310. These three layers form the dielectric material 100 between the conductive pad 110 and the insulation layer 60 on top of the upper buried conductive layer 20. The conductive pad 110 lies directly on top of the stress relief layer 310.

The stress relief layer 310 consists of oxide such as silicon oxide and is deposited as described above in connection with FIG. 5. Accordingly, a lateral and a vertical stress gradient is induced inside the layer 310 in order to achieve the described "relief behavior".

The blocking layer 420 preferably comprises silicon nitride (E-module approx. 300 GPa), silicon oxynitride or silicon carbide (E-module approx. 400 GPa). The E-module of the blocking layer 420 exceeds the E-module of the stress release layer 310 and the E-module of the soft layer 410 in order to fulfill its "blocking function". The blocking layer's E-module should exceed 200 GPa. The thickness of the blocking layer is preferably about 50 nm.

The soft layer 410 is the softest layer of the structure; its E-module is preferably below 200 GPa. The soft layer may consist of FSG-oxide with an E-module of approx. 180 GPa.

The structure according to FIG. 6 works as follows. A vertical mechanical stress induced by the probe needle 120 is transformed into a lateral mechanical stress by the stress relief layer 310. In order to totally block a transition of remaining stress into other layers of the device, the blocking layer 420 is positioned right below the stress relief layer 310. As the blocking layer 420 is arranged on top of the soft layer 410, the blocking layer 420 can move slightly and absorb forces that were not led off by the stress relief layer 310, e.g., a small amount of the vertical force. As a result, the stress blocking structure which consists of the soft layer 410, the blocking layer 420 and the stress relief layer 310, prevents cracks 150, which may appear by mechanical stress, propagates down to the buried conducting layers 20 and 30. Accordingly, no short-circuits can result.

Figure 7:
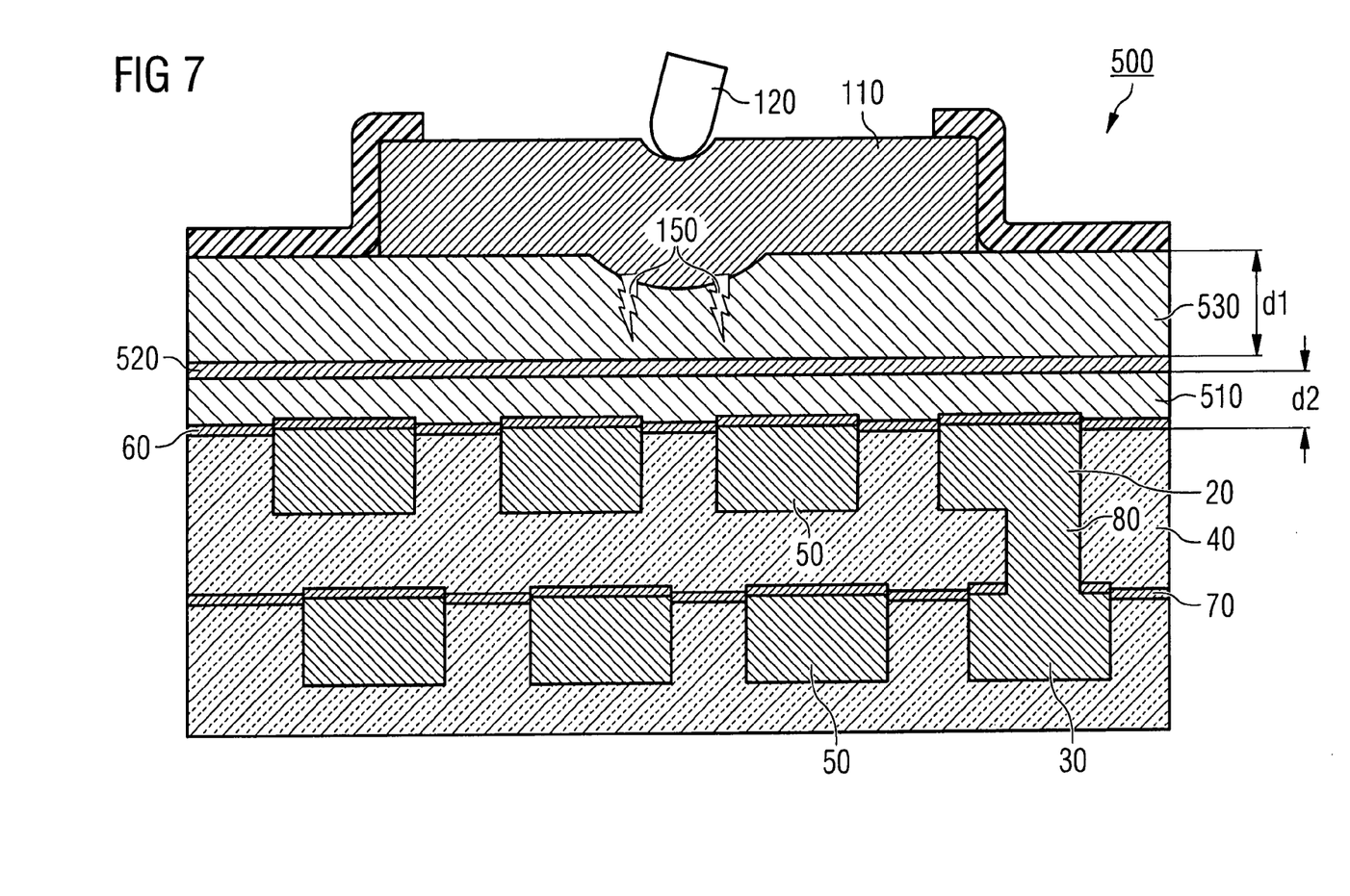

FIG. 7 shows a device 500 according to a third embodiment of the invention. This device 500 comprises a stress blocking structure containing a soft layer 510, a blocking layer 520 and a stress relief layer 530.

The stress relief layer 530 preferably comprises standard oxide such as silicon oxide and is deposited in a usual manner according to prior art methods. This means, that the stress relief layer 530 does not provide an internal layer structure that transfers vertical external stress into lateral mechanical stress by itself, in this regard, the stress relief layer 530 is a "normal" layer. For example, the stress relief layer 530 may be deposited by a plasma enhanced CVD process. In one embodiment, the thickness d1 of the stress relief layer 530 is about 750 nm and its E-module is about 70 GPa.

The blocking layer 520 consists of silicon carbide, silicon nitride or silicon oxynitride. The blocking layer 520 is the hardest layer of the stress blocking structure; accordingly, its E-module exceeds the E-modules of both the stress release layer and the soft layer. The E-module of the blocking layer 520 should exceed at least 200 GPa. The thickness of the blocking layer is preferably about 50 nm.

The soft layer 510 is the softest layer of the structure; its E-module is preferably below 200 GPa. The soft layer may consist of FSG-oxide with an E-module of approx. 180 GPa. Its thickness d2 is about 200 nm.

The stress blocking structure according to FIG. 7 works efficiently even though the stress relief layer 530 does not provide a vertical-lateral force transformation by itself. Nevertheless, the structure prevents device faults due to cracks efficiently. Mechanical forces applied by the probe needle 120 may lead to cracks 150 inside the stress relief layer 530, but these cracks 150 cannot propagate down to the buried conductive layer 40 as they are blocked by the blocking layer 520. The blocking layer 520 is able to block or pin the cracks 150 as this layer is very hard (E-module is large). Additionally, the blocking layer 520 is situated on the soft layer 510; therefore, residual mechanical forces can be absorbed by the soft layer 510.

A fourth embodiment of the invention (not shown in Figures) is quite similar to the embodiment according to FIG. 7; just thickness d of the stress relief layer 530 is different. The thickness d1 is approx. 1500 nm. Other embodiments with thicknesses between these two examples are also envisioned. The other layers of the fourth embodiment can be identical to those of the third embodiment.

Figure 8:
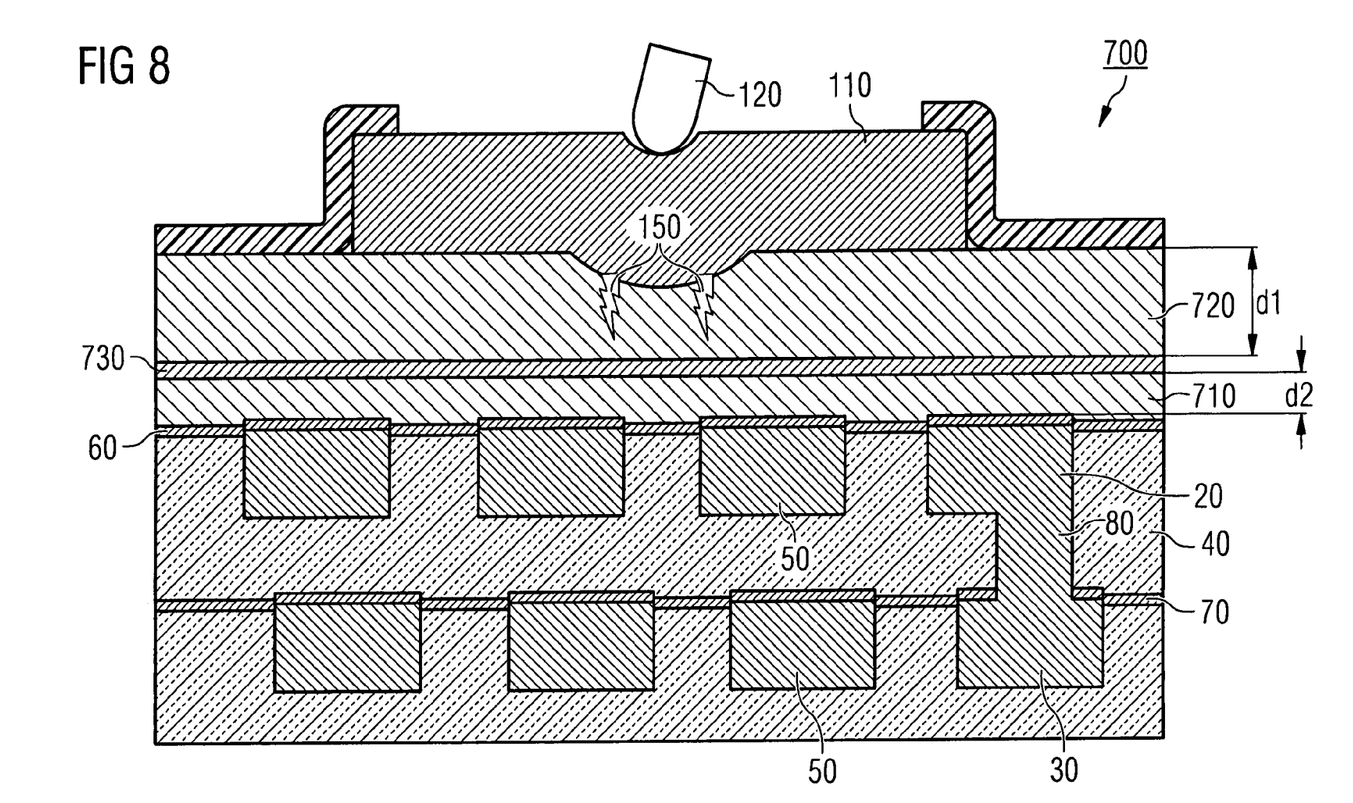

FIG. 8 shows a device 700 according to a fifth embodiment of the invention. The device 700 comprises a sandwich structure as stress blocking structure. This sandwich structure contains a lower FSG-oxide layer 710, an upper FSG-oxide layer 720 and a blocking layer 730 between both FSG-oxide layers 710 and 720.

In one embodiment, the thickness d1 of the upper FSG-layer 720 is approx. 500 nm and the thickness d2 of the lower FSG-layer 710 is about 200 nm. The FSG-layers' E-modules are about 180 GPa. The blocking layer 730 can comprise silicon carbide, silicon nitride or silicon oxynitride. The thickness of the blocking layer is preferably about 50 nm in this embodiment.

According to a sixth embodiment of the invention (not shown in figures), the thickness d1 of the upper FSG-layer is 1500 nm. The other layers of the sixth embodiment are identical to those of the fifth embodiment.

What is claimed is:

1. A semiconductor device comprising:
   a semiconductor component integrated in a semiconductor substrate;
   a conductive pad arranged over said semiconductor device, wherein said conductive pad is electrically connected with said semiconductor component and wherein said pad is arranged for connecting said semiconductor device externally; and
   a dielectric material positioned between said conductive pad and a buried conductive layer of said semiconductor device, wherein said dielectric material comprises a stress blocking structure.

2. The semiconductor device according to claim 1, wherein said stress blocking structure comprises a stress relief layer that contains a material which at least partially transforms a vertical mechanical stress gradient into a lateral stress gradient.

3. The semiconductor device according to claim 2, wherein said dielectric material further comprises a first additional layer adjacent the stress relief layer.

4. The semiconductor device according to claim 3, wherein said first additional layer is a blocking layer having an E-module exceeding an E-module of said stress relief layer.

5. The semiconductor device according to claim 4, wherein said blocking layer is arranged below said stress relief layer.

6. The semiconductor device according to claim 5, wherein the E-module of said blocking layer exceeds at least 200 GPa.

7. The semiconductor device according to claim 6, wherein said blocking layer comprises at least one of silicon oxynitride, silicon nitride or silicon carbide.

8. The semiconductor device according to claim 5, wherein said blocking layer is separated from said buried conductive layer by an insulation layer disposed directly on top of said buried conductive layer.

9. The semiconductor device according to claim 8, wherein said insulation layer comprises silicon-nitride.

10. The semiconductor device according to claim 5, wherein said dielectric material further comprises a second additional layer adjacent the blocking layer.

11. The semiconductor device according to claim 10, wherein said second additional layer is a soft layer having an E-module smaller than the E-module of said blocking layer.

12. The semiconductor device according to claim 11, wherein said soft layer is arranged below said blocking layer.

13. The semiconductor device according to claim 12, wherein the E-module of said soft layer is smaller than 200 GPa.

14. The semiconductor device according to claim 13, wherein said soft layer comprises FSG-oxide.

15. The semiconductor device according to claim 12, wherein said soft layer is separated from said conductive layer by an insulation layer deposited directly on top of said buried conductive layer.

16. The semiconductor device according to claim 15, wherein said insulation layer comprises silicon nitride.

17. The semiconductor device according to claim 15, wherein the E-module of said blocking layer exceeds at least 200 GPa.

18. The semiconductor device according to claim 17, wherein said blocking layer comprises at least one of silicon oxynitride, silicon nitride or silicon carbide.

19. The semiconductor device according to claim 1, wherein said stress blocking structure comprises at least three layers including a soft layer, a blocking layer and a stress relief layer;
wherein the stress relief layer is arranged on top of the blocking layer and the blocking layer being arranged on top of the soft layer; and
wherein an E-module of the blocking layer exceeds E-modules of both the soft layer and the stress relief layer.

20. The semiconductor device according to claim 19, wherein the soft layer and the stress relief layer comprise materials with different E-modules, and wherein the E-Module of the stress relief layer exceeds the E-Module of the soft layer.

21. The semiconductor device according to claim 20, wherein the E-module of said soft layer is smaller than 200 GPa.

22. The semiconductor device according to claim 21, wherein said soft layer comprises FSG-oxide.

23. The semiconductor device according to claim 21, wherein the E-module of said stress release layer exceeds 200 GPa.

24. The semiconductor device according to claim 23, wherein said blocking layer comprises at least one of silicon oxynitride, silicon nitride or silicon carbide.

25. The semiconductor device according to claim 19, wherein the soft layer and the stress relief layer comprise the same soft material.

26. The semiconductor device according to claim 25, wherein the E-module of said soft material is smaller than 200 GPa.

27. The semiconductor device according to claim 26, wherein said soft material comprises FSG-oxide.

28. The semiconductor device according to claim 27, wherein said blocking layer comprises at least one of silicon oxynitride, silicon nitride or silicon carbide.

29. A method of fabricating a semiconductor device, the method comprising:
integrating a semiconductor component in a semiconductor substrate;
depositing a conductive layer;
depositing a dielectric material with a stress blocking structure on top of said conductive layer; and
fabricating a conductive pad on top of said dielectric material and electrically connecting said pad with said semiconductor component.

30. The method according to claim 29, wherein depositing a dielectric material with a stress blocking structure comprises forming a stress relief layer that includes a material that transforms a vertical mechanical stress gradient into a lateral stress gradient.

31. The method according to claim 29, wherein said stress blocking structure is fabricated by depositing at least three layers including a soft layer, a blocking layer and a stress relief layer;
the stress relief layer being arranged on top of the blocking layer and the blocking layer being arranged on top of the soft layer; and
an E-module of the blocking layer exceeding E-modules of both the soft layer and the stress relief layer.

32. The method according to claim 31, wherein the soft layer and the stress relief layer comprise materials with different E-modules; and wherein the E-module of the stress relief layer exceeds the E-module of the soft layer.

33. The method according to claim 32, wherein the E-module of the soft layer is smaller than 200 GPa.

34. The method according to claim 31, wherein the soft layer and the stress relief layer are made of the same soft material.

35. The method according to claim 34, wherein the E-module of said soft material is smaller than 200 GPa.

* * * * *